(12) United States Patent
Boisvert et al.

(10) Patent No.: US 7,049,640 B2
(45) Date of Patent: May 23, 2006

(54) LOW CAPACITANCE AVALANCHE PHOTODIODE

(75) Inventors: Joseph C. Boisvert, Thousand Oaks, CA (US); Rengarajan Sudharsanan, Stevenson Ranch, CA (US)

(73) Assignee: The Boeing Company, Chicago, IL (US)

( * ) Notice: Subject to any disclaimer, the term of this patent is extended or adjusted under 35 U.S.C. 154(b) by 12 days.

(21) Appl. No.: 10/883,315

(22) Filed: Jun. 30, 2004

(65) Prior Publication Data

US 2006/0001118 A1    Jan. 5, 2006

(51) Int. Cl.
*H01L 29/732* (2006.01)

(52) U.S. Cl. ........................ 257/186; 257/189

(58) Field of Classification Search .......... 257/186, 257/189, 199, 438
See application file for complete search history.

(56) References Cited

U.S. PATENT DOCUMENTS

| 6,326,649 B1 | 12/2001 | Chang et al. |
| 6,730,979 B1 | 5/2004 | Boisvert |

*Primary Examiner*—Douglas W Owens
(74) *Attorney, Agent, or Firm*—Jonathan W. Hallman; MacPherson Kwok Chen & Heid

(57) ABSTRACT

An avalanche photodiode having a reduced capacitance is provided. The avalanche photodiode includes a wide band gap layer in its depletion region. The width of the wide band gap layer increases the extent of the depletion region, thereby reducing the capacitance while minimizing the impact on the dark current.

16 Claims, 3 Drawing Sheets

LOW CAPACITANCE AVALANCHE PHOTODIODE

TECHNICAL FIELD

This invention relates generally to photodiodes, and more particularly to a low capacitance avalanche photodiode.

BACKGROUND

An intrinsic semiconductor possesses relatively poor conductivity. The vast majority of the electrons in an intrinsic semiconductor are in the valence band whereas relatively few electrons are in the conduction band. The band gap between the valence and conduction bands presents an energy barrier which inhibits the movement of electrons from the valence band to the conduction band. When exposed to light, however, electrons may be excited from the valence band to the conduction band. The promoted electron and the resulting positive charge left behind in the valence band form an electron-hole pair (EHP). As more and more EHPs are created, the conductivity will increase substantially. Solid-state optical detectors (photodetectors) exploit this increase in conductivity, denoted as photoconductivity, to detect and/or measure optical excitation. Photodiodes form a particularly useful group of solid-state optical detectors, providing a rapid and sensitive response to optical or high-energy radiation.

In contrast to other types of solid-state optical devices, photodiodes possess a single p-n junction. Should a photodiode be used as a photodetector, the p-n junction is typically reverse biased, thereby forming a relatively wide depletion region. The current through the reverse-biased p-n junction will be a function of the optically-generated electron-hole pairs. Carriers resulting from an electron-hole pair formation in the depletion region are swept out by the electric field resulting from the reverse bias, thereby providing a rapid response. With the proper doping and reverse biasing, the carriers resulting from an electron-hole formation cause impact ionization of other carriers in a multiplication region, a process denoted as avalanche breakdown. Photodiodes configured for such breakdown are denoted as avalanche photodiodes. Because a single optically-induced carrier may produce many additional avalanche-ionized carriers, the resulting photocurrent gain makes avalanche photodiodes very sensitive and high-speed optical detectors.

The avalanche breakdown process, being stochastic, is inherently noisy. To minimize this noise, the doping profile and position of the multiplication region are typically configured to favor the carrier type having a larger ionization efficiency. Another problem avalanche photodiodes must minimize is the dark current, which is the generation current across the p-n junction resulting from thermally-created carriers in the absence of any light excitation. As implied by the name, separate absorption and multiplication (SAM) avalanche photodiodes separate the absorption region from the multiplication region to reduce the dark current. SAM avalanche photodiodes are typically heterojunction semiconductor devices comprised of different III–V materials such as InGaAs and InP. A low band gap material such as InGaAs is used within the absorption region whereas a high band gap material such as InP forms the multiplication region. Because of this arrangement, the electric field is much higher in the multiplication region as compared to the absorption region. Low band gap materials will typically have greater tunneling current (dark current). However, because the electric field is relatively low across the low band band gap material, tunneling dark current is suppressed.

Regardless of whether the absorption region and the multiplication region are separated, avalanche photodiodes (APDs) may reduce noise by preferentially injecting carriers having a higher ionization efficiency (holes or electrons) into the multiplication region. High-speed photodetectors using APDs require electronic amplifiers that set the noise floor and limit sensitivity. The current gain provided by APDs alleviates the sensitivity limitation. However, the noise suffers if the APD capacitance and/or the dark current are too large.

One approach to minimize APD capacitance is to reduce the device area. Each pixel in an APD array must be isolated from adjacent pixels such that there is a fixed area around each pixel that cannot detect light. To minimize the dead space between pixels, it is desirable to increase the area that collects and amplifies the light signal. However, as the pixel size is decreased to reduce APD capacitance, the "fill factor" or ratio of light receiving to total-array size decreases. To prevent this undesirable tradeoff, a "microlens" may be used to focus light from a relatively large area such as 100×100 um onto a relatively small area such as 20×20 um to achieve a high fill factor while having a small pixel dimension. However, such an approach requires significant additional processing on the backside of a fragile semiconductor wafer as well as demanding relatively tight alignment tolerances between the front side APD pixel pattern and the backside microlens pattern.

Accordingly, there is a need in the art for avalanche photodiodes having reduced capacitance.

SUMMARY

In accordance with one aspect of the invention, a reduced-capacitance avalanche photodiode (APD) is provided. The APD includes: an absorption region; a multiplication region having a larger band gap than the absorption region, the avalanche photodiode being configured such that the absorption and multiplication regions are included in a depletion region when the avalanche photodiode is reverse-biased; and an undoped wide band gap layer within the depletion region to reduce the capacitance of the avalanche photodiode without increasing the dark current.

In accordance with another aspect of the invention, an avalanche photodiode is provided that includes: a cap layer having a first conductivity type; a substrate having a second conductivity type opposite to that of the first conductivity type, wherein the avalanche photodiode is configured such that a depletion region extends between the cap layer and the substrate if the avalanche photodiode is reverse-biased; and a relatively-thick wide band gap layer within the depletion region.

In accordance with another aspect of the invention, an avalanche photodiode is provided that includes: a substrate; a buffer layer overlaying the substrate; a contact layer overlaying the buffer layer; a multiplication layer overlaying the buffer layer; a charge layer overlaying the multiplication layer; a grading layer overlaying the charge layer; an absorption layer overlaying the grading layer; a relatively-thick layer overlaying the absorption layer, the relatively-thick layer having a wider band gap than a band gap possessed by the absorption layer; and a cap layer overlaying the relatively-thick layer.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
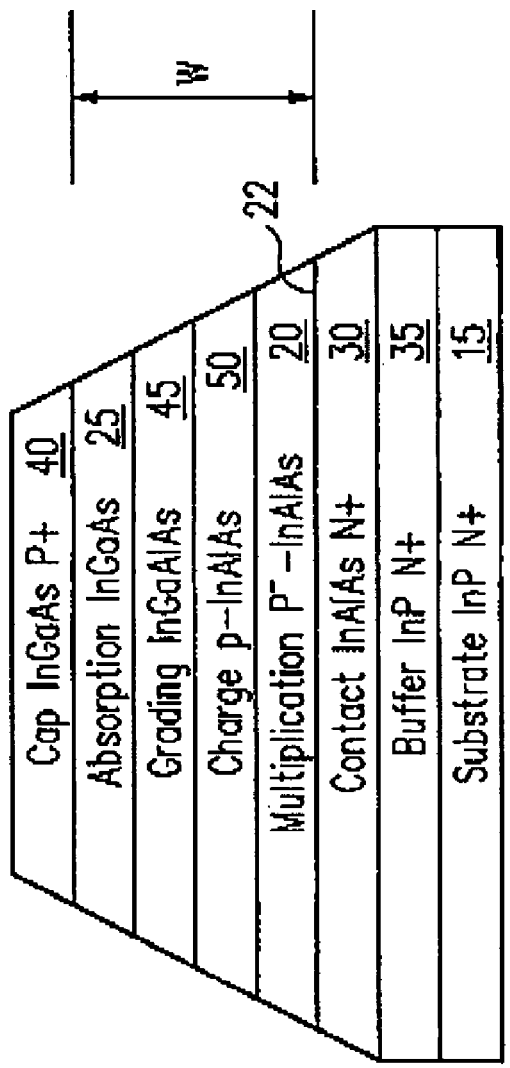
FIG. 1 is a cross-sectional view of a prior art separate absorption and multiplication avalanche photodiode (SAM APD).
Figure 1:
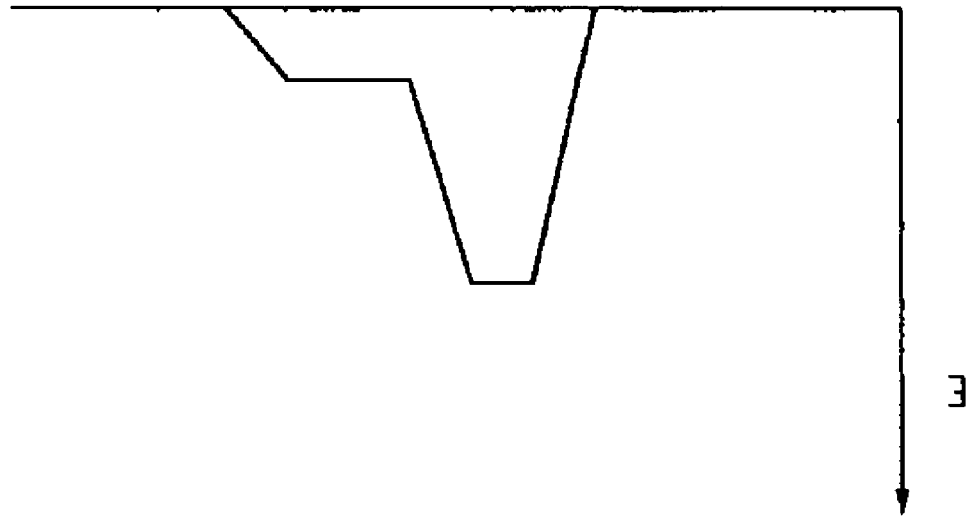

The present invention will be described with respect to a separate absorption and multiplication (SAM) avalanche photodiode (APD). However, the present invention may be widely applied to non-SAM avalanche photodiodes as well. Turning now to the Figures, the present invention may be better understood through comparison to a conventional SAM APD 10 as shown in cross-sectional view in FIG. 1. SAM APD 10 includes an n+InP substrate 15 upon which a p− InAlAs multiplication layer 20 and an intrinsic (or p−) InGaAs absorption layer 25 are deposited using, for example, epitaxial techniques. As discussed previously, SAM APDs are typically configured to favor the injection of one carrier type into multiplication layer 20, which in this embodiment would be an electron injection. Optically-induced electrons in absorption layer 25 are swept by the reverse-biased electric field into multiplication layer 20. As can be seen from the electric field profile also shown in FIG. 1, the field is considerably increased in multiplication layer 20 as compared to the field in absorption layer 25 through the use of a wide band gap charge layer 50. Thus, whereas little tunneling (dark) current flows through absorption layer 25, an electric field sufficient to achieve optical gain is formed in multiplication layer 20. Optically-induced electrons that drift into multiplication region 20 can thus release other electrons through energetic collisions with host atoms. The p-n junction 22 may be formed using a heavily doped n+ InAlAs contact layer 30. An n+ buffer layer 35 of InP lies between contact layer 30 and substrate 10. An ohmic contact is provided by a p+ InGaAs layer 40. To reduce electron trapping, an intrinsic grading layer 45 lies between absorption layer 35 and charge layer 50. Suitable materials for charge layer 50 include p− InAlAs whereas grading layer 45 may be formed using InGaAlAs. Because layers 20, 25, 45, and 50 are lightly doped or intrinsic as compared to contact layer 30 and cap layer 40, the depletion region W extends across these layers and only minimally into layers 30 and 40. Absorption layer 25 has a relatively narrow band gap as compared to the relatively wider band gap possessed by multiplication layer 20 and charge layer 50.

Figure 2:
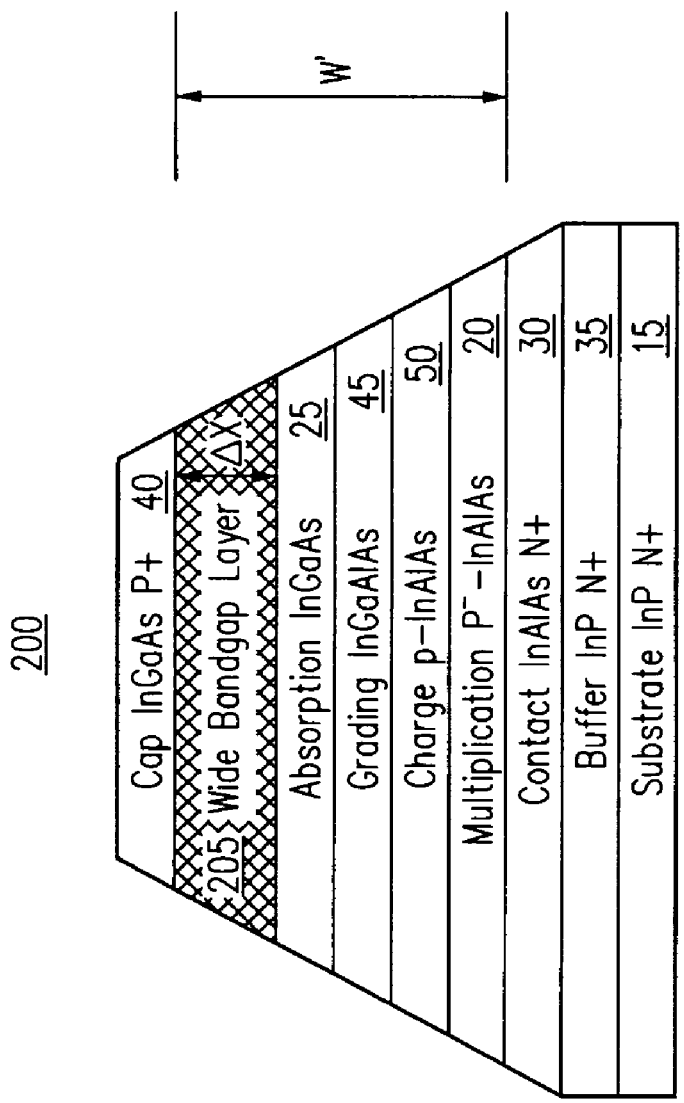
FIG. 2 is a cross-sectional view of a SAM APD with an undoped wide band gap layer in its depletion region to reduce the capacitance according to one embodiment of the invention.

If the depletion region W can be enlarged, the capacitance per unit area for SAM APD 10 would be reduced. However, adding material to an APD's depletion region W will typically increase the dark current. In the present invention, a wideband gap layer is inserted into the depletion region W. Advantageously, the capacitance per unit area is reduced while the deleterious impact on dark current is minimized because a wide band gap material has less dark current generation per unit volume than, for example, narrow band gap absorption layer 25. Referring now to FIG. 2, a cross-sectional view of a SAM APD 200 in accordance with an exemplary embodiment of the invention is illustrated. SAM APD 200 includes layers 15 through 50 as discussed with respect to FIG. 1. However, between absorption layer 25 and cap layer 40 is a wide band gap layer 205. The thickness of wide band gap layer 205 is denoted as ΔX whereas the depletion region for SAM APD 200 is denoted as W'. Assuming the common layers in depletion regions W (FIG. 1) and W' have the same thickness, it may be seen that the depletion layer W' is increased with respect to W by the ΔX thickness of wide band gap layer 205. The thickness ΔX of wide band gap layer 205 may be varied to produce the desired reduction in capacitance per unit area. For example, whereas the depletion region width W is typically 2 to 3 micrometers in conventional SAM APDs, wide band gap layer 205 will have thickness ΔX greater than 1 micrometer, thereby making the depletion width W' for SAM APD 200 approximately 3 to 4 micrometers. Typically, the material forming layer wide band gap layer 205 will have a band gap greater than 1 eV and more preferably closer to 1.5 eV.

Figure 3:
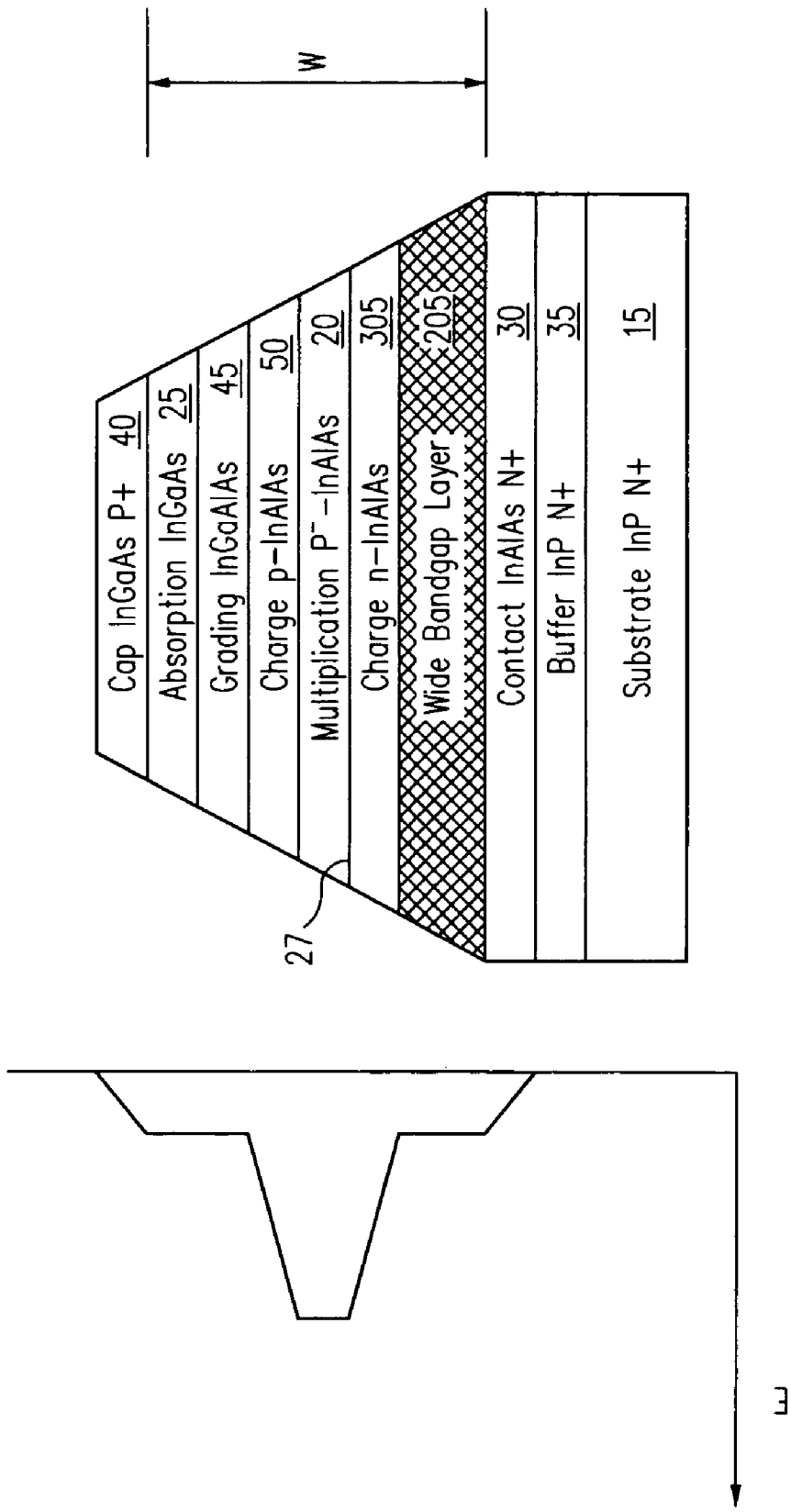
FIG. 3 is a cross-sectional view of a SAM APD with a wide band gap layer in its depletion region to reduce the capacitance according to another embodiment of the invention.

As known in the arts for heterojunction APDs, the various layers in SAM APD 200 are lattice matched to the InP substrate 15. To minimize any effects on dark current generation, wide band gap layer 205 should have a background doping concentration of less than $10^{15}/cm^3$. Thus, wide band gap layer 205 may be undoped, although a light concentration of p-type dopants may occur through diffusion from p+ cap layer 40. A wide variety of lattice-matched semiconductor substances having the desired band gap may be used such as InP, InAlAs, InAlGaAs, and InGaAsP. The latter two materials are quaternaries that can form a continuum of band gaps between InGaAs (0.73 eV) and either InAlAs (1.45 eV) or InP (1.35 eV) Because of the additional capacitance provided by wide band gap layer 205, SAM APD 200 may also be denoted as a separate absorption multiplication and low-capacitance (SMAL-C) avalanche photodiode. During an epitaxial deposition of the various layers, it may be sent that layer 205 will be deposited fairly late into the fabrication of the semiconductor stack that forms SMAL-C APD 200. By depositing wide band gap layer 205 earlier in the semiconductor stack fabrication process, the exposure of charge layer 50 to the high temperatures used to grow, for example, wide band gap layer 205 may be minimized. Turning now to FIG. 3, a cross-sectional view of a SMAL-C APD 300 in accordance with an exemplary embodiment of the invention is illustrated, wherein wide band gap layer 205 is deposited earlier in the fabrication process. In SMAL-C APD 300, wide band gap layer 205 is deposited on contact layer 30. This layer would be typically undoped and result in a lightly-doped n-type layer. To prevent wide band gap layer 205 from being exposed to the high fields present at p-n junction 27, an additional n− InAlAs charge layer 305 separates wide band gap layer 205 from p-n junction 27. Charge layer 305 reduces the electric field across wide band gap layer 205 to prevent further avalanche multiplication from occurring in layer 205 as well as to minimize dark current generation.

Those of ordinary skill in the art will appreciate that many modifications may be made to the embodiments described herein. For example, silicon-based APDs that have a SAM architecture may also be modified to include a wide band gap layer in their depletion. Accordingly, although the invention has been described with respect to particular embodiments, this description is only an example of the invention's application and should not be taken as a limitation. Consequently, the scope of the invention is set forth in the following claims.

We claim:

1. An avalanche photodiode, comprising:
a cap layer;
an absorption region;
a multiplication region having a larger band gap than the absorption region, the avalanche photodiode being configured such that the absorption and multiplication regions are included in a depletion region if the avalanche photodiode is reverse-biased; and
a wide band gap layer between the cap layer and the absorption region.

2. The avalanche photodiode of claim 1, wherein the cap layer is located at a first end of the depletion region and has a first conductivity type, the avalanche photodiode further comprising:
a substrate having a second conductivity type opposite to that of the first conductivity type at a second opposing end of the depletion region.

3. The avalanche photodiode of claim 2, wherein the cap layer is doped p+ and the substrate is doped n+.

4. The avalanche photodiode of claim 1, wherein the wide band gap layer has a thickness greater than 1 micrometer.

5. The avalanche photodiode of claim 1, wherein the wide band gap layer is undoped.

6. The avalanche photodiode of claim 1, wherein the wide band gap layer is lightly doped.

7. The avalanche photodiode of claim 1, wherein the wide band gap layer comprises a material selected from the group consisting of InP, InAlAs, InAlGaAs, and InGaAsP.

8. The avalanche photodiode of claim 7, wherein the wide band gap layer comprises InAlAs.

9. The avalanche photodiode of claim 7, wherein the wide band gap layer comprises InP.

10. An avalanche photodiode, comprising:
a cap layer having a first conductivity type;
a substrate having a second conductivity type opposite to that of the first conductivity type, wherein the avalanche photodiode is configured such that a depletion region extends between the cap layer and the substrate if the avalanche photodiode is reverse-biased;
a buffer layer overlaying the substrate;
a contact layer overlaying the buffer layer; and
a wide band gap layer within the depletion region, wherein the wide band gap layer is contiguous with the contact layer.

11. The avalanche photodiode of claim 10, wherein the substrate is doped n+.

12. The avalanche photodiode of claim 11, wherein the cap layer is doped p+.

13. An avalanche photodiode, comprising:
a substrate;
a buffer layer overlaying the substrate;
a contact layer overlaying the buffer layer;
a multiplication layer overlaying the buffer layer;
a charge layer overlaying the multiplication layer;
a grading layer overlaying the charge layer;
an absorption layer overlaying the grading layer;
a wide band gap layer overlaying the absorption layer, the wide bandgap layer having a wider band gap than a band gap possessed by the absorption layer; and
a cap layer overlaying the wide band gap layer.

14. The avalanche photodiode of claim 13, wherein the substrate layer is doped n+ and the cap layer is doped p+.

15. The avalanche photodiode of claim 14, wherein the wide band gap layer is undoped.

16. The avalanche photodiode of claim 14, wherein the wide band gap layer has a dopant concentration of less than $10^{15}/cm^3$.

* * * * *